(12) United States Patent
Utsumi (10) Patent No.: US 11,495,543 B2
(45) Date of Patent: Nov. 8, 2022

(54) SEMICONDUCTOR DEVICE CAPABLE OF PREVENTING AN INCREASE IN THE NUMBER OF MANUFACTURING STEPS RELATING TO WIRING AND A METHOD FOR MANUFACTURING THE SAME

(71) Applicant: Kioxia Corporation, Tokyo (JP)

(72) Inventor: Tetsuaki Utsumi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 258 days.

(21) Appl. No.: 17/004,234

(22) Filed: Aug. 27, 2020

(65) Prior Publication Data
US 2021/0233846 A1 Jul. 29, 2021

(30) Foreign Application Priority Data

Jan. 24, 2020 (JP) .............................. JP2020-010348

(51) Int. Cl.
| | |
|---|---|
| *H01L 23/535* | (2006.01) |
| *H01L 27/11519* | (2017.01) |
| *H01L 27/11524* | (2017.01) |
| *H01L 27/11556* | (2017.01) |
| *H01L 21/768* | (2006.01) |
| *H01L 27/1157* | (2017.01) |
| *H01L 27/11582* | (2017.01) |

(Continued)

(52) U.S. Cl.
CPC ...... *H01L 23/535* (2013.01); *H01L 21/76805* (2013.01); *H01L 21/76895* (2013.01); *H01L 23/5226* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ............... H01L 23/535; H01L 23/5226; H01L 21/76805; H01L 21/76895; H01L 27/11519; H01L 27/11524; H01L 27/11556; H01L 27/11565; H01L 27/1157; H01L 27/11582
See application file for complete search history.

(56) References Cited

U.S. PATENT DOCUMENTS

| | | | | |
|---|---|---|---|---|
| 5,970,375 A | * | 10/1999 | Gardner | ............ H01L 21/76895 438/626 |
| 9,564,451 B1 | | 2/2017 | Shin et al. | |

(Continued)

*Primary Examiner* — Shahed Ahmed
*Assistant Examiner* — Vicki B. Booker
(74) *Attorney, Agent, or Firm* — Foley & Lardner LLP (57) ABSTRACT

A semiconductor device includes a substrate and a first semiconductor layer and a second semiconductor layer each extending in a first direction perpendicular to a surface of the substrate. Furthermore, the semiconductor device includes a first plug provided on the first semiconductor layer and a second plug provided on the second semiconductor layers, and a connection wiring having an upper surface that is at a same height along the first direction as upper surfaces of the first and second plugs, and having a lower surface that is at a same height along the first direction as lower surfaces of the first and second plugs. Furthermore, the semiconductor device includes a first wiring provided on the first plug and the connection wiring and a second wiring provided on the second plug and the connection wiring.

19 Claims, 10 Drawing Sheets

(51) Int. Cl.
*H01L 23/522* (2006.01)
*H01L 27/11565* (2017.01)

(56) References Cited

U.S. PATENT DOCUMENTS

| | | |
|---|---|---|
| 10,276,585 B2 | 4/2019 | Utsumi |
| 2015/0036407 A1* | 2/2015 | Nakajima ............ H01Q 1/2283 365/63 |
| 2016/0163732 A1 | 6/2016 | Lim et al. |
| 2019/0081017 A1 | 3/2019 | Nakajima |

* cited by examiner

SEMICONDUCTOR DEVICE CAPABLE OF PREVENTING AN INCREASE IN THE NUMBER OF MANUFACTURING STEPS RELATING TO WIRING AND A METHOD FOR MANUFACTURING THE SAME

CROSS-REFERENCE TO RELATED APPLICATION(S)

This application is based upon and claims the benefit of priority from Japanese Patent Application No. 2020-010348, filed Jan. 24, 2020, the entire contents of which are incorporated herein by reference.

FIELD

Embodiments described herein relate generally to a semiconductor device and a method for manufacturing the same.

BACKGROUND

When a wiring is disposed on a substrate, the wiring may be disposed such that the wiring detours around other structures on the substrate. In this case, the number of manufacturing steps of the semiconductor device may increase due to this detour, which may increase manufacturing costs of the semiconductor device.

Examples of related art include JP-A-2018-26518, US Patent Application No. 2019/0081017, and U.S. Pat. No. 9,564,451.

DETAILED DESCRIPTION

At least one embodiment provides a semiconductor device capable of preventing an increase in the number of manufacturing steps relating to wiring, and a method for manufacturing the same.

In general, according to at least one embodiment, there is provided a semiconductor device including a substrate and a first semiconductor layer and a second semiconductor layer that each extend in a first direction perpendicular to a surface of the substrate. Furthermore, the semiconductor device includes a first plug provided on the first semiconductor layer, a second plug provided on the second semiconductor layer, and a connection wiring having an upper surface that is at a same height along the first direction as upper surfaces of the first and second plugs, and having a lower surface that is at a same height along the first direction as lower surfaces of the first and second plugs. Furthermore, the semiconductor device includes a first wiring provided on a first plug and the connection wiring, and a second wiring provided on the second plug and the connection wiring.

Hereinafter, at least one embodiment of the present disclosure will be described with reference to the drawings. In FIGS. 1 to 10C, the same components are denoted by the same reference numerals, and duplicate description thereof will be omitted.

First Embodiment

Figure 1:
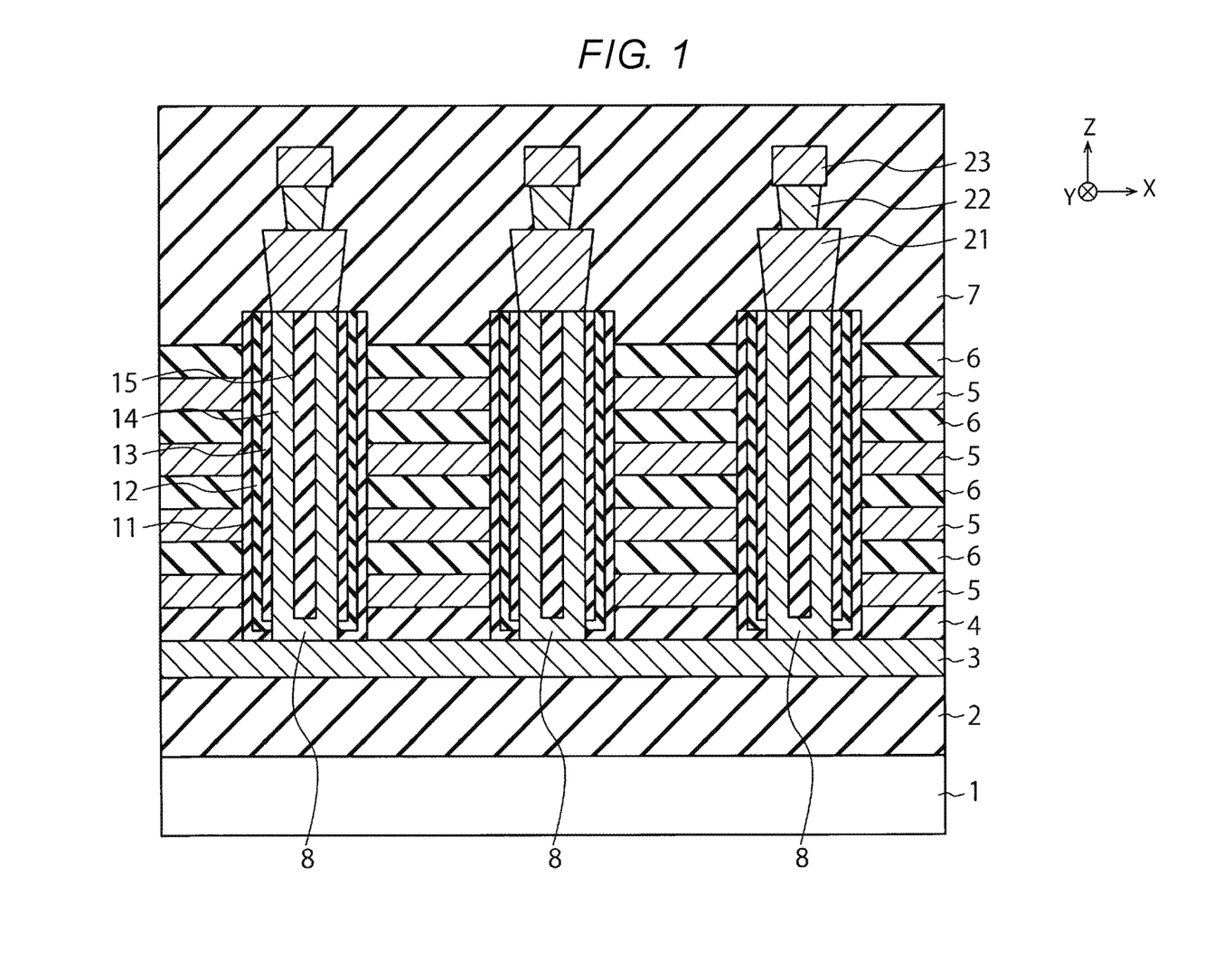
FIG. 1 is a cross-sectional view illustrating a structure of a semiconductor device according to a first embodiment.

FIG. 1 is a cross-sectional view illustrating a structure of a semiconductor device of a first embodiment. The semiconductor device in FIG. 1 includes a three-dimensional memory.

The semiconductor device of FIG. 1 includes a substrate 1, an interlayer insulating film 2, an electrode layer 3, an interlayer insulating film 4, a plurality of electrode layers 5, a plurality of insulating layers 6, an interlayer insulating film 7, and a plurality of columnar portions 8. Each columnar portion 8 includes a block insulating film 11, a charge storage layer 12, a tunnel insulating film 13, a channel semiconductor layer 14, and a core insulating film 15. The semiconductor device of FIG. 1 further includes a plurality of contact plugs 21, a plurality of via plugs 22, and a plurality of wirings 23.

The substrate 1 is, for example, a semiconductor substrate such as a silicon substrate. In FIG. 1, an X-direction and a Y-direction parallel to the surface of the substrate 1 and perpendicular to each other, and a Z-direction perpendicular to the surface of the substrate 1 are illustrated. In this specification, the +Z-direction is treated as an upward direction and the −Z-direction is treated as a downward direction. The −Z-direction may or may not coincide with a gravity direction. The Z-direction is an example of a first direction, and the X-direction is an example of a second direction.

The interlayer insulating film 2 is formed on the substrate 1. The interlayer insulating film 2 may be, for example, a silicon oxide film. The interlayer insulating film 2 may be another insulating film, or may be a stacked film including a silicon oxide film and another insulating film.

The electrode layer 3 is formed on the interlayer insulating film 2. The electrode layer 3 is, for example, a metal layer or a polysilicon layer, and functions as a source line of the three-dimensional memory. The electrode layer 3 may be a stacked film including a metal layer and a polysilicon layer. The semiconductor device of at least one embodiment may include one or more wiring layers between the substrate 1 and the electrode layer 3.

The interlayer insulating film 4 is formed on the interlayer insulating film 2 with the electrode layer 3 interposed therebetween. The interlayer insulating film 4 is, for example, a silicon oxide film. The interlayer insulating film 4 may be another insulating film or a stacked film including a silicon oxide film and another insulating film.

The plurality of electrode layers 5 and the plurality of insulating layers 6 are alternately stacked on the interlayer insulating film 4. Each electrode layer 5 includes, for example, a barrier metal layer such as a titanium nitride film (TiN) and an electrode material layer such as a tungsten (W) layer, and functions as a word line of the three-dimensional memory. The number of electrode layers 5 is, for example, sixty-four layers, but is four layers in FIG. 1 for convenience of illustration. Each insulating layer 6 is, for example, a silicon oxide film. The number of insulating layers 6 may be, for example, sixty-four layers, but is four layers in FIG. 1 for convenience of illustration.

The interlayer insulating film 7 is formed on the interlayer insulating film 4 with the electrode layers 5 and the insulating layers 6 interposed therebetween. The interlayer insulating film 7 is, for example, a silicon oxide film. The interlayer insulating film 7 may be another insulating film, or may be a stacked film including a silicon oxide film and another insulating film.

The plurality of columnar portions 8 are formed in the electrode layers 5 and the insulating layers 6 described above, and have a columnar shape extending in the Z-direction. The block insulating film 11, the charge storage layer 12, the tunnel insulating film 13, the channel semiconductor layer 14, and the core insulating film 15 are sequentially formed in the electrode layer 5 and the insulating layer 6 described above. The block insulating film 11 is, for example, a silicon oxide film. The charge storage layer 12 is, for example, a silicon nitride film. The charge storage layer 12 may be a polysilicon layer. The tunnel insulating film 13 is, for example, a silicon oxide film. The channel semiconductor layer 14 is, for example, a polysilicon layer. The channel semiconductor layer 14 of this embodiment is electrically connected to the electrode layer 3. The core insulating film 15 is, for example, a silicon oxide film. The channel semiconductor layer 14 is an example of first and second semiconductor layers, and the charge storage layer 12 is an example of first and second charge storage layers corresponding to the first and second semiconductor layers.

Figure 2:
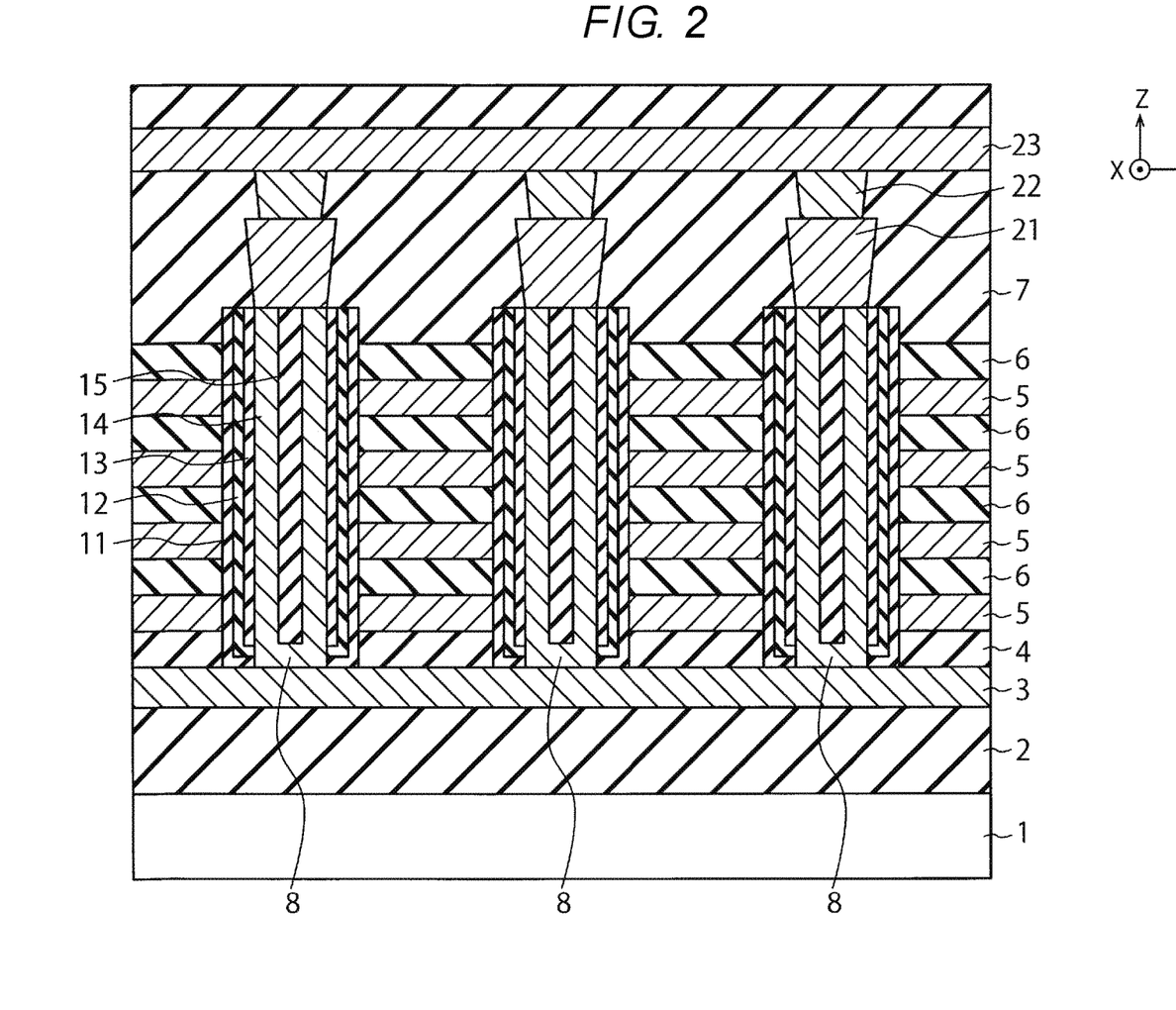
FIG. 2 is another cross-sectional view illustrating the structure of the semiconductor device of the first embodiment.

Each contact plug 21 may be formed in the interlayer insulating film 7 and disposed on the channel semiconductor layer 14 of the corresponding columnar portion 8. Each contact plug 21 includes, for example, a barrier metal layer such as a titanium nitride film and a plug material layer such as a tungsten layer. As illustrated in FIGS. 1 and 2, each contact plug 21 has a columnar shape extending in the Z-direction. FIG. 2 is another cross-sectional view illustrating the structure of the semiconductor device of at least one embodiment. FIGS. 1 and 2 respectively illustrate an XZ cross-section and a YZ cross-section of the semiconductor device of at least one embodiment. The contact plug 21 is an example of first and second plugs.

Each via plug 22 is formed in the interlayer insulating film 7 and is formed on the corresponding contact plug 21. Each via plug 22 includes, for example, a barrier metal layer such as a titanium nitride film and a plug material layer such as a tungsten layer. As illustrated in FIGS. 1 and 2, each via plug 22 has a columnar shape extending in the Z-direction. The via plug 22 is an example of third to sixth plugs.

Each wiring 23 is formed in the interlayer insulating film 7, and is disposed on a plurality of corresponding via plugs 22, as illustrated in FIGS. 1 and 2. The plurality of wirings 23 of at least one embodiment are adjacent to each other in the X-direction, extend in the Y-direction, and function as the bit lines of the three-dimensional memory. Each wiring 23 may include, for example, a barrier metal layer such as a titanium (Ti) layer, a titanium nitride film (TiN), a tantalum (Ta) layer, a tantalum nitride film (TaN), and a wiring material layer such as a tungsten (W) layer, an aluminum (Al) layer, and a copper (Cu) layer. The wiring 23 is an example of the first and second wirings.

Further details of the contact plug 21, the via plug 22, and the wiring 23 of this embodiment will be described later.

Figure 3:
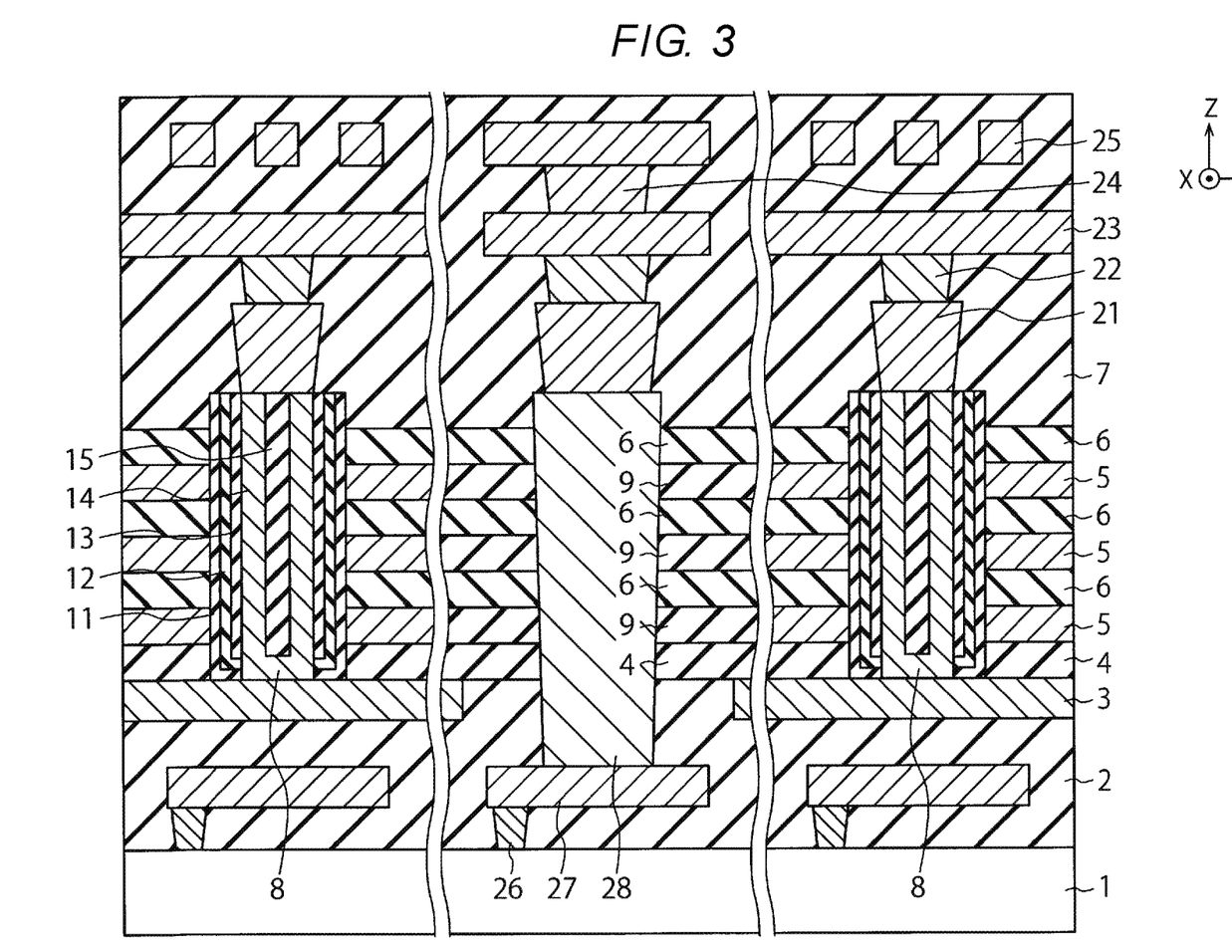
FIG. 3 is another cross-sectional view illustrating the structure of the semiconductor device of the first embodiment.

FIG. 3 is another cross-sectional view illustrating the structure of the semiconductor device of at least one embodiment. FIG. 3 illustrates a YZ cross-section of the semiconductor device of this embodiment similarly to FIG. 2, but illustrates a YZ cross-section wider than that in FIG. 2.

In FIG. 3, a left-side region in which the plurality of columnar portions 8 are disposed, a right-side region in which the plurality of columnar portions 8 are disposed, and a central region between the left-side region and the right-side region are illustrated. In FIG. 3, one of the plurality of columnar portions 8 in the left-side region and one of the plurality of columnar portions 8 in the right-side region are illustrated. In FIGS. 1 and 2, either the left-side region or the right-side region is illustrated.

These three regions include the contact plug 21, the via plug 22 formed on the contact plug 21, the wiring 23 formed on the via plug 22, a via plug 24 formed on the wiring 23, and a wiring 25 formed on the via plug 24. In these three regions, a contact plug 26 formed on the substrate 1 and a wiring 27 formed on the contact plug 26 are further represented. A wiring layer including the wiring 27 is disposed between the substrate 1 and the electrode layer 3. The semiconductor device of at least one embodiment may further include one or more wiring layers between the substrate 1 and the electrode layer 3.

As described above, the semiconductor device of at least one embodiment includes the plurality of electrode layers 5 and the plurality of insulating layers 6 that are alternately formed on the interlayer insulating film 4. These electrode layers 5 and the insulating layers 6 are formed as follows, for example. First, a plurality of insulating layers 9 and the plurality of insulating layers 6 are alternately formed on the interlayer insulating film 4. The insulating layer 9 is, for example, a silicon nitride film. Next, the plurality of columnar portions 8 are formed in the insulating layers 9 and the insulating layers 6. Next, a plurality of slits penetrating the insulating layers 9 and the insulating layers 6 are formed, and the insulating layers 9 are removed from these slits. Next, the plurality of electrode layers 5 are formed in a plurality of cavities formed by removing the insulating layers 9. In this way, the plurality of electrode layers 5 and the plurality of insulating layers 6 that are alternately formed on the interlayer insulating film 4 are formed.

When the insulating layer 9 is removed from the slit, the insulating layer 9 remains without being removed at a location away from the slit. The insulating layer 9 in the central region of FIG. 3 represents the insulating layer 9 thus remaining.

The semiconductor device of this embodiment further includes a via plug 28 in the central region. The via plug 28 is formed in the insulating layers 9 and the insulating layers 6 described above, and has a columnar shape extending in the Z-direction. The via plug 28 includes, for example, a barrier metal layer such as a titanium nitride film and a plug material layer such as a tungsten layer. In this embodiment, the via plug 28 is formed on the wiring 27 and the contact plug 21 is formed on the via plug 28. The via plug 28 of at least one embodiment electrically connects a wiring or the like formed at a position lower than the electrode layer 5, the insulating layer 6, and the insulating layer 9 described above and a wiring or the like formed at a position higher than the electrode layer 5, the insulating layer 6, and the insulating layer 9. For example, the via plug 28 of this embodiment is electrically connected to the wiring 27 and the contact plug 21. The via plug 28 is an example of a seventh plug. Furthermore, the electrode layer 5 is an example of a first electrode layer, the insulating layer 9 is an example of a first insulating layer, and the insulating layer 6 is an example of a second insulating layer. Furthermore, the electrode layer 3 is an example of a second electrode layer, and the wiring 27 is an example of a third wiring.

Figure 4:
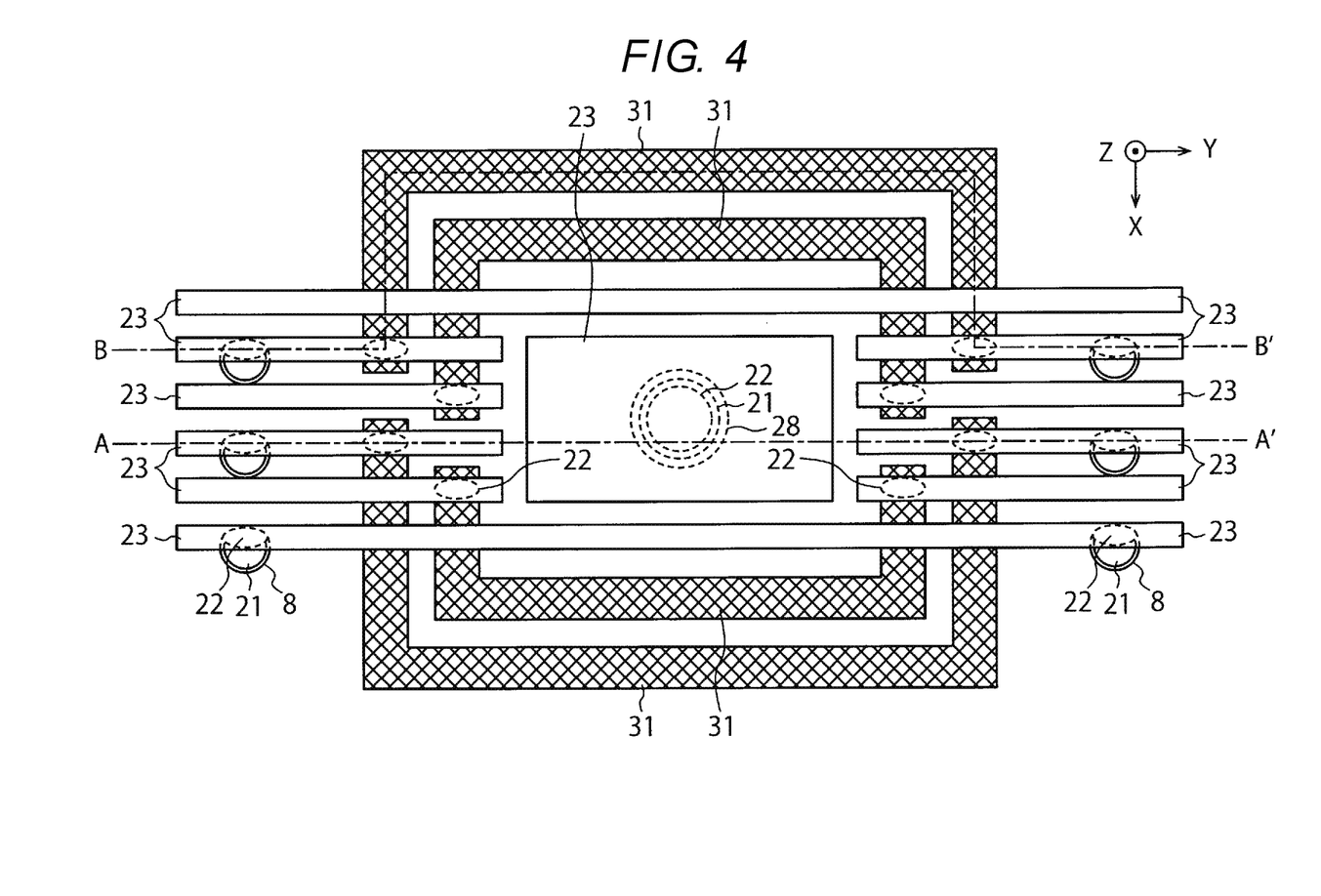
FIG. 4 is a plan view illustrating the structure of the semiconductor device of the first embodiment.

FIG. 4 is a plan view illustrating the structure of the semiconductor device of at least one embodiment. FIG. 4 illustrates a planar structure of the three regions in FIG. 3. On the other hand, FIG. 3 illustrates a YZ cross-section along line A-A' in FIG. 4.

In FIG. 4, the columnar portion 8, the contact plug 21, the via plug 22, the wiring 23, and the via plug 28 described above are illustrated. Each contact plug 21 is disposed on the corresponding columnar portion 8 or via plug 28. Each via plug 22 is disposed on the corresponding contact plug 21.

In FIG. 4, as an example of the wiring 23, ten wirings 23 extending in the Y-direction and having a linear shape and one wiring 23 disposed above the via plug 28 and having a rectangular plate shape are illustrated. In FIG. 4, four connection wirings 31 are further illustrated.

The ten wirings 23 described above include two long wirings 23 and eight short wirings 23. The former wirings 23 function as two bit lines. On the other hand, the latter wirings 23 include four wirings 23 on the left-side and four wirings 23 on the right-side, and each wiring 23 on the left-side is electrically connected to the corresponding wiring on the right-side via one connection wiring 31. As a result, these eight wirings 23 function as four bit lines. As such, in FIG. 4, six bit lines are illustrated.

In at least one embodiment, the wiring 23 on the right-side that corresponds to the wiring 23 on the left-side is positioned in the +Y-direction of the wiring 23 on the left-side. That is, the wiring 23 on the left-side and the wiring 23 on the right-side, that correspond to each other, are positioned on the same straight line.

Here, the wiring 23 on the left-side, the wiring 23 on the right-side, and the connection wiring 31 provided on the line B-B' in FIG. 4 will be described. The wiring 23 on the left-side is disposed on the columnar portion 8 via the contact plug 21 and the via plug 22, and is disposed on the connection wiring 31 via the via plug 22. Similarly, the wiring 23 on the right-side is disposed on the columnar portion 8 via the contact plug 21 and the via plug 22, and is disposed on the connection wiring 31 via the via plug 22. As a result, the wiring 23 on the left-side and the wiring 23 on the right-side are electrically connected to each other via the connection wiring 31. The connection wiring 31 extends in the −X-direction near the wiring 23 on the left-side, further extends in the +Y-direction, and further extends in the +X-direction near the wiring 23 on the right-side.

The reason for adopting such a disposition in at least one embodiment is that the structure (contact plug 21, via plug 22, and wiring 23) on the via plug 28 is disposed between the wiring 23 on the left-side and the wiring 23 on the right-side. If the wiring 23 on the left-side and the wiring 23 on the right-side are integrated into one wiring such as the long wiring 23 described above, the integrated wiring comes in contact with or comes too close to the structure. If the connection wiring 31 is extended only in the +Y-direction, the connection wiring 31 comes into contact with or comes too close to the structure.

Therefore, in at least one embodiment, one bit line is divided into the wiring 23 on the left-side and the wiring 23 on the right-side, the wiring 23 on the left-side and the wiring 23 on the right-side are electrically connected by the connection wiring 31, and the connection wiring 31 detours the structure. With this configuration, it is possible to prevent the bit line from coming into contact with or coming too close to the structure. This is the same for the wiring 23 on the left-side, the wiring 23 on the right-side, and the connection wiring 31 provided on lines other than the B-B' line.

Here, further description will be made on the shapes of the contact plug 21, the via plug 22, and the wiring 23 on each columnar portion 8. In at least one embodiment, the contact plug 21 has a circular planar shape and the via plug 22 has an elliptical planar shape. In addition, a diameter of the via plug 22 in the Y-direction is set to be substantially the same as a diameter of the contact plug 21, and the diameter of the via plug 22 in the X-direction is set to be shorter than the diameter of the contact plug 21. The diameter of the via plug 22 in the X-direction is set to be approximately half the diameter of the contact plug 21. A width of the wiring 23 in the X-direction in at least one embodiment is set to be substantially the same as the diameter of the via plug 22 in the X-direction. The via plug 22 of at least one embodiment is disposed at the end portion of the upper surface of the contact plug 21 in the −X-direction, but may be disposed at the end portion of the upper surface of the contact plug 21 in the +X-direction or may be disposed at the center of the upper surface of the contact plug 21. The contact plug 21, the via plug 22, and the wiring 23 may have other shapes.

Figure 5:
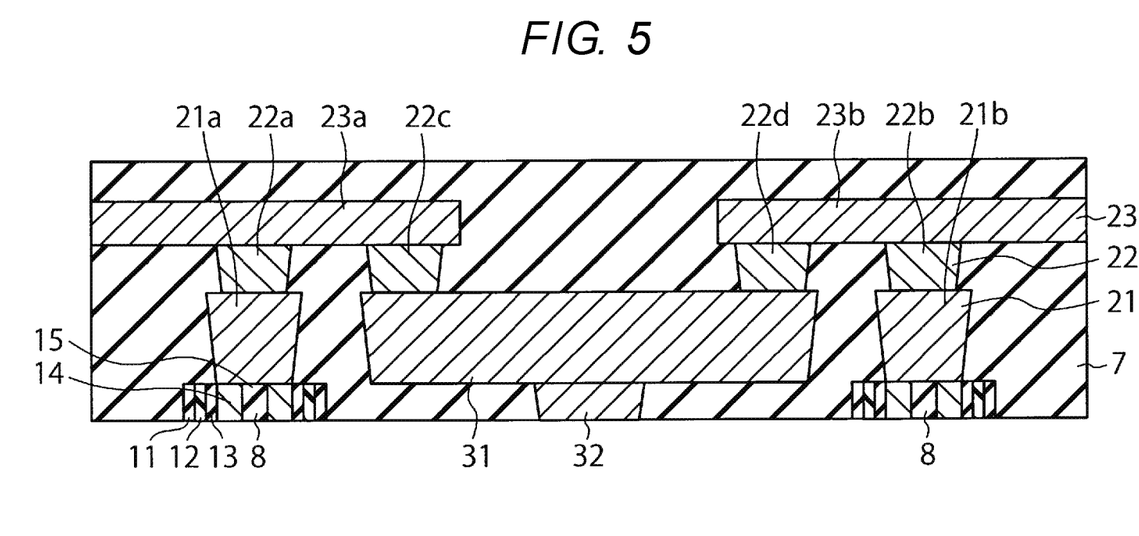
FIG. 5 is a cross-sectional view taken along line B-B' illustrated in FIG. 4.

FIG. 5 is a cross-sectional view taken along line B-B' illustrated in FIG. 4.

In FIG. 5, as an example of the contact plug 21, the via plug 22, and the wiring 23, a contact plug 21*a*, a via plug 22*a*, and a wiring 23*a* formed on the channel semiconductor layer 14 of the columnar portion 8 on the left-side and a contact plug 21*b*, a via plug 22*b*, and a wiring 23*b* formed on the channel semiconductor layer 14 of the columnar portion 8 on the right-side are illustrated. The contact plug 21*a*, the via plug 22*a*, and the wiring 23*a* are examples of the first plug, the third plug, and the first wiring, respectively. The contact plug 21*b*, the via plug 22*b*, and the wiring 23*b* are examples of the second plug, the fifth plug, and the second wiring, respectively.

In FIG. 5, via plugs 22*c* and 22*d* formed on the connection wiring 31 are further illustrated as examples of the via plug 22. The wiring 23*a* is formed on the via plug 22*a* and the via plug 22*c*. The wiring 23*b* is formed on the via plug 22*b* and the via plug 22*d*. The via plug 22*c* is an example of the fourth plug, and the via plug 22*d* is an example of the sixth plug. The connection wiring 31 of at least one embodiment is formed on a via plug 32, and is electrically connected to the wiring and the like formed at a position lower than the electrode layer 5, insulating layer 6, and insulating layer 9 described above via the via plug 32.

As illustrated in FIG. 5, the connection wiring 31 of at least one embodiment has an upper surface that is at the same height as the upper surface of the contact plug 21 and a lower surface that is at the same height as the lower surface of the contact plug 21. In at least one embodiment, a wiring layer for forming the contact plug 21 and the connection wiring 31 is formed and the wiring layer is divided into individual contact plugs 21 and the connection wiring 31, thereby forming the connection wiring 31 having such upper surface and lower surface. That is, the contact plug 21 and the connection wiring 31 of at least one embodiment are simultaneously formed by dividing the same wiring layer.

Therefore, the contact plug 21 and the connection wiring 31 of at least one embodiment may be made of the same material. For example, the contact plug 21 includes a titanium nitride film that is a barrier metal layer and a tungsten layer that is a plug material layer. Similarly, the connection wiring 31 includes a titanium nitride film that is a barrier metal layer and a tungsten layer that is a wiring material layer.

Therefore, according to at least one embodiment, the connection wiring 31 can be formed without increasing the number of manufacturing steps of the semiconductor device for forming the connection wiring 31. The reason is that the connection wiring 31 is formed together with the contact plug 21 in the step of forming the contact plug 21. With this configuration, it is possible to prevent an increase in the number of manufacturing steps of the semiconductor device and prevent an increase in manufacturing costs of the semiconductor device.

Figure 6:
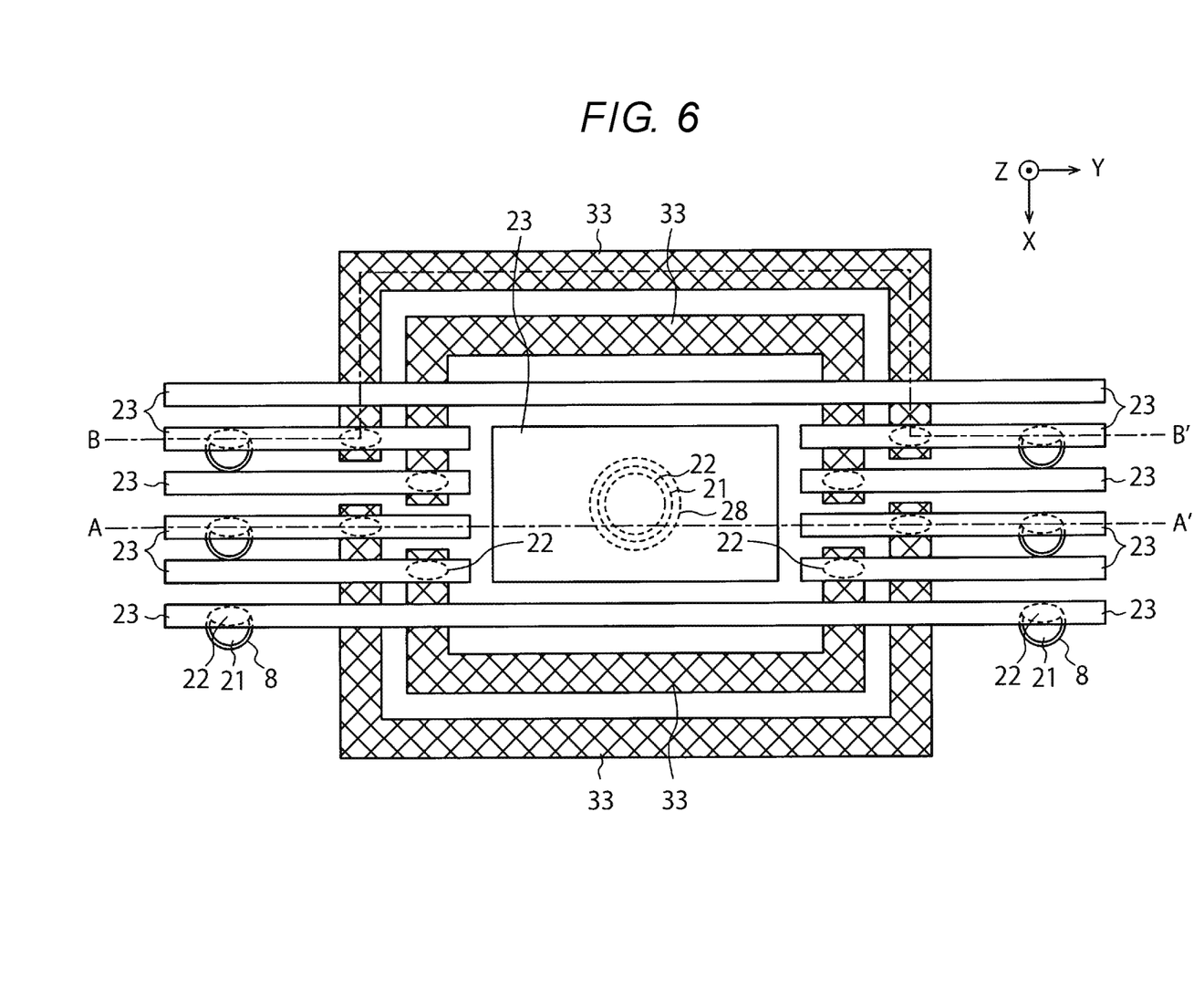
FIG. 6 is a plan view illustrating a structure of a semiconductor device of a comparative example of the first embodiment.

FIG. 6 is a plan view illustrating a structure of a semiconductor device of a comparative example of the first embodiment. The semiconductor device (FIG. 6) of this comparative example has the same structure as the semiconductor device (FIG. 4) of at least one embodiment. However, in this comparative example, the connection wiring 31 is replaced with a connection wiring 33.

Figure 7:
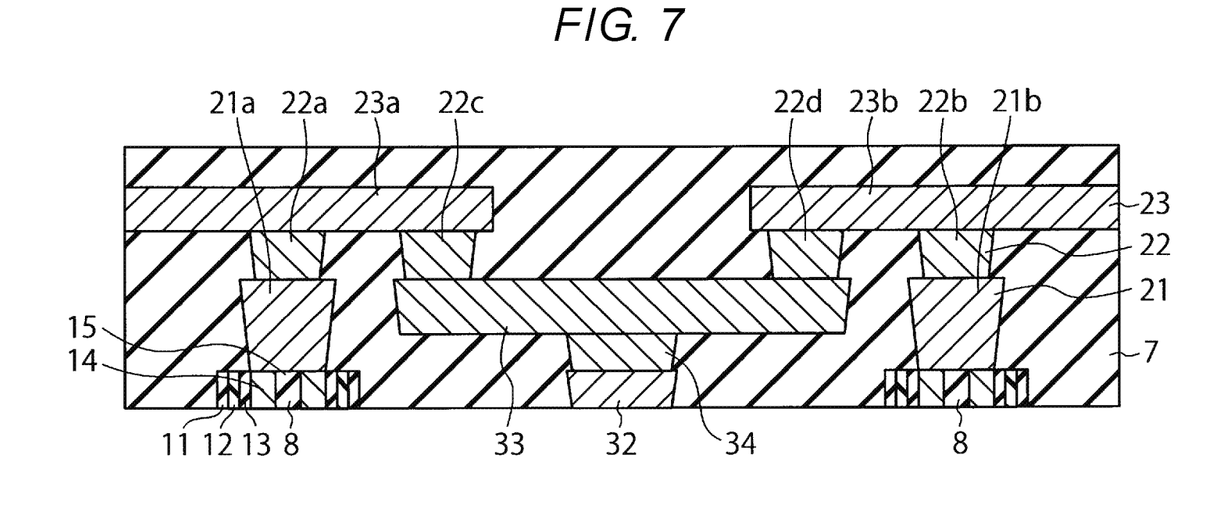
FIG. 7 is a cross-sectional view taken along line B-B' illustrated in FIG. 6.

FIG. 7 is a cross-sectional view taken along line B-B' illustrated in FIG. 6.

A position where the connection wiring 33 of this comparative example is disposed is similar to the position where the connection wiring 31 of at least one embodiment is disposed. However, as illustrated in FIG. 7, the connection wiring 33 of this comparative example has an upper surface at the same height as the upper surface of the contact plug 21, but has a lower surface at a position higher than the lower surface of the contact plug 21. For that reason, the connection wiring 33 of this comparative example is formed on the via plug 32 via another via plug 34.

A wiring groove for the connection wiring 33 of this comparative example is formed in a step different from the step of forming a contact hole for the contact plug 21. Specifically, lithography and etching for forming the wiring groove are performed separately from etching for forming the contact hole. For that reason, when the connection wiring 33 is formed, the number of manufacturing steps of the semiconductor device is increased and the manufacturing costs of the semiconductor device are increased. On the other hand, according to at least one embodiment, such a problem can be prevented by forming the wiring groove for the connection wiring 31 in the step of forming the contact hole for the contact plug 21.

Figure 8:
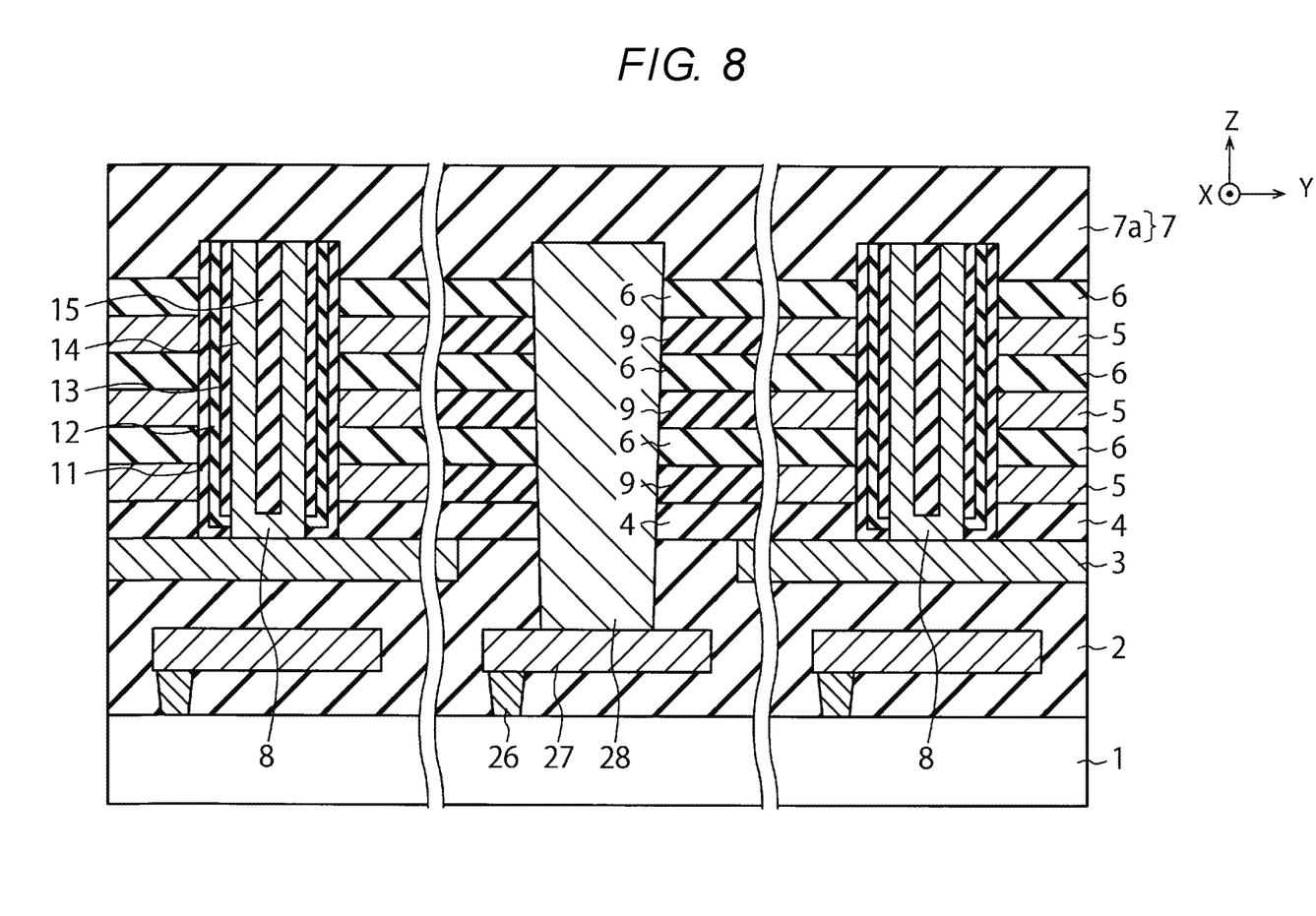
FIG. 8 is a cross-sectional view (1/3) illustrating a method for manufacturing the semiconductor device of the first embodiment.

FIGS. 8 to 10C are cross-sectional views illustrating the method for manufacturing the semiconductor device of the first embodiment. FIG. 8 illustrates a cross-section corresponding to FIG. 3, and FIGS. 9A to 10C illustrate cross-sections corresponding to FIG. 5.

First, on the substrate 1, the interlayer insulating film 2, the electrode layer 3, the interlayer insulating film 4, the electrode layer 5, the insulating layer 6, an interlayer insulating film 7a (a part of the interlayer insulating film 7), the columnar portion 8, the insulating layer 9, the contact plug 26, the wiring 27, and the via plug 28 are formed (FIG. 8).

The electrode layer 5 and the insulating layer 6 are formed as follows, for example. First, a plurality of insulating layers 9 and a plurality of insulating layers 6 are alternately formed on the interlayer insulating film 4. Next, a plurality of columnar portions 8 are formed in the insulating layers 9 and the insulating layers 6. Next, a plurality of slits penetrating the insulating layers 9 and the insulating layers 6 are formed, and the insulating layers 9 are removed from these slits. Next, the plurality of electrode layers 5 are formed in a plurality of cavities formed by removing the insulating layers 9. In this way, the plurality of electrode layers 5 and the plurality of insulating layers 6 that are alternately formed on the interlayer insulating film 4 are formed.

When the insulating layer 9 is removed from the slit, the insulating layer 9 remains without being removed at a location away from the slit. The insulating layer 9 in the central region of FIG. 8 represents the insulating layer 9 thus remaining.

Each columnar portion 8 is formed as follows, for example. First, a memory hole is formed in the interlayer insulating film 4, the insulating layer 9, and the insulating layer 6. Next, the block insulating film 11, the charge storage layer 12, and the tunnel insulating film 13 are sequentially formed in the memory hole. Next, the block insulating film 11, the charge storage layer 12, and the tunnel insulating film 13 are removed from the bottom of the memory hole to expose the electrode layer 3 in the memory hole. Next, the channel semiconductor layer 14 and the core insulating film 15 are sequentially formed in the memory hole. With this configuration, the channel semiconductor layer 14 is electrically connected to the electrode layer 3. In this way, each columnar portion 8 is formed in the interlayer insulating film 4, the insulating layer 9, and the insulating layer 6. In this method, the block insulating film 11, the charge storage layer 12, the tunnel insulating film 13, and a part of the channel semiconductor layer 14 may be sequentially formed in the memory hole, these elements may be removed from the bottom of the memory hole, and then the remaining part of the channel semiconductor layer 14 and the core insulating film 15 may be sequentially formed in the memory hole.

The via plug 28 is formed, for example, by forming a via hole in the interlayer insulating film 2, the interlayer insulating film 4, the insulating layer 9, and the insulating layer 6 and burying the material of the via plug 28 in the via hole. The via plug 28 may be formed before the step of removing the insulating layer 9 or may be formed after the step of removing the insulating layer 9.

Figure 9A:
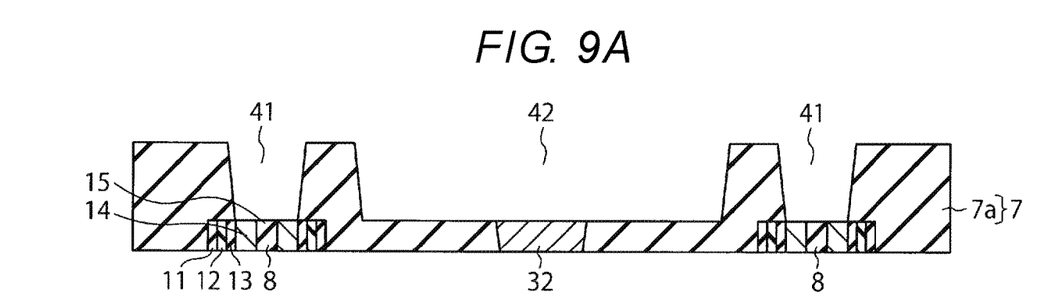
FIGS. 9A to 9C are cross-sectional views (2/3) illustrating the method for manufacturing the semiconductor device of the first embodiment.
Figure 9B:
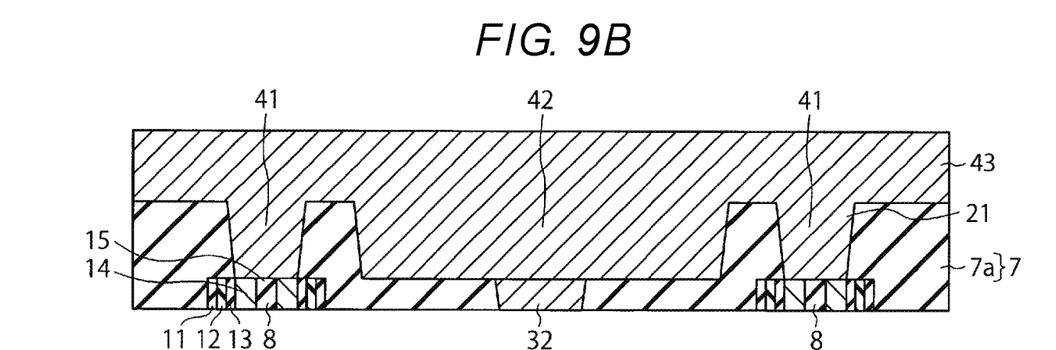

Next, a contact hole 41 and a wiring groove 42 are simultaneously formed in the interlayer insulating film 7a by reactive ion etching (RIE) (FIG. 9A). In at least one embodiment, a resist film for forming the contact hole 41 and the wiring groove 42 is formed on the interlayer insulating film 7a, the resist film is patterned by lithography, and the contact hole 41 and the wiring groove 42 are simultaneously formed by RIE using the patterned resist film. Next, a wiring layer 43 is formed on the entire surface of the substrate 1 (FIG. 9B). As a result, the wiring layer 43 is formed in the contact hole 41 and the wiring groove 42. The wiring layer 43 includes, for example, a barrier metal layer such as a titanium nitride film and a wiring material layer (plug material layer) such as a tungsten layer. In at least one embodiment, the via plug 32 is formed before the step of FIG. 9A, but may be formed between the step of FIG. 9A and the step of FIG. 9B, for example.

Figure 9C:
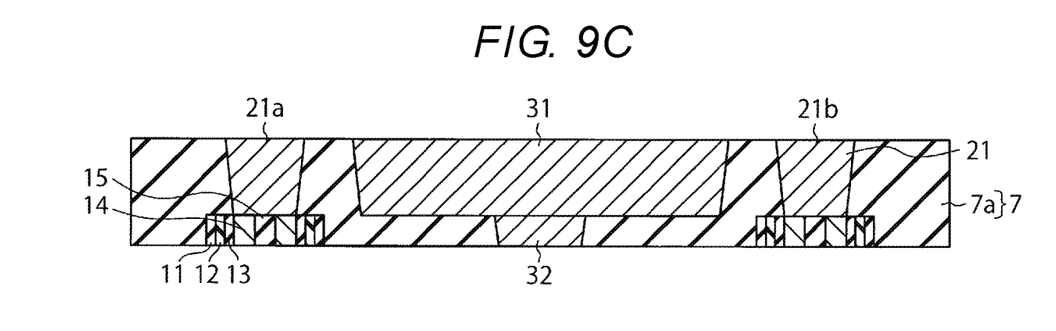

Next, the surface of the wiring layer 43 is planarized by chemical mechanical polishing (CMP) (FIG. 9C). As a result, the wiring layer 43 outside the contact hole 41 and the wiring groove 42 is removed, and the wiring layer 43 is divided into the wiring layer 43 inside the contact hole 41 and the wiring layer 43 inside the wiring groove 42. With this configuration, the contact plug 21 is buried in the contact hole 41 and the connection wiring 31 is buried in the wiring groove 42.

As such, the contact plug 21 and the connection wiring 31 of this embodiment are simultaneously formed by dividing the same wiring layer 43. Therefore, the connection wiring 31 of at least one embodiment has an upper surface that is at the same height as the upper surface of the contact plug 21 and a lower surface that is at the same height as the lower surface of the contact plug 21.

Figure 10A:
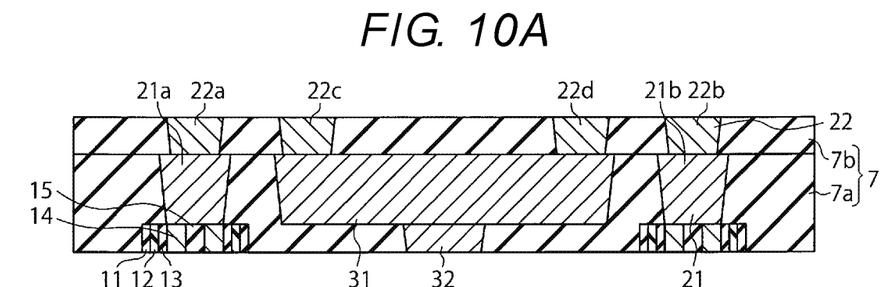
FIGS. 10A to 10C are cross-sectional views (3/3) illustrating the method for manufacturing the semiconductor device of the first embodiment.
Figure 10B:
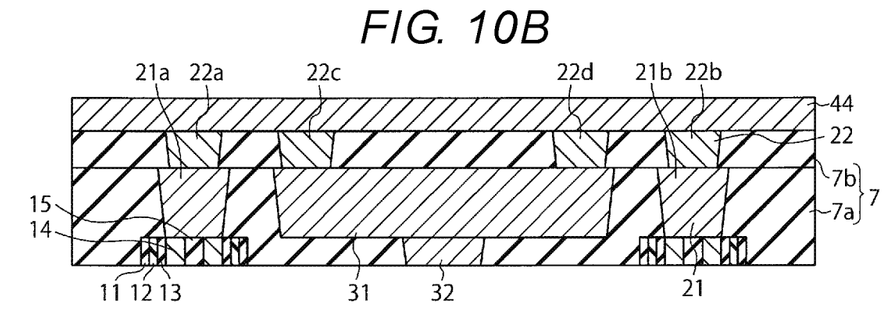

Next, an interlayer insulating film 7b (a part of the interlayer insulating film 7) is formed on the interlayer insulating film 7a, and the via plug 22 is formed in the interlayer insulating film 7b (FIG. 10A). The via plug 22 is formed as follows, for example. First, a via hole is formed in the interlayer insulating film 7b and the contact plug 21 and the connection wiring 31 are exposed in the via hole. Next, the via plug 22 is formed by burying the material of the via plug 22 in the via hole.

Figure 10C:
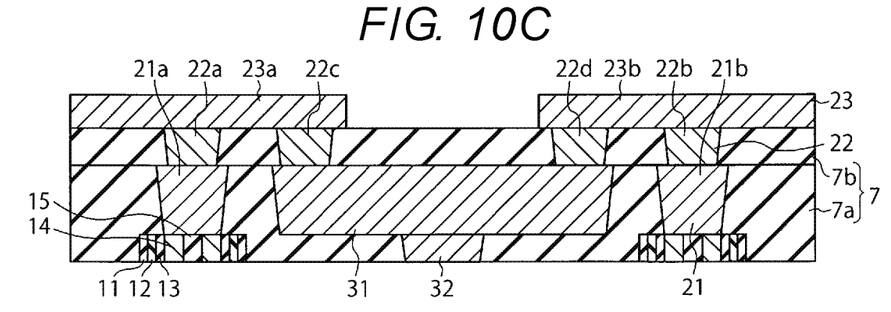

Next, a wiring layer 44 is formed on the entire surface of the substrate 1 (FIG. 10B), and the wiring layer 44 is processed by RIE (FIG. 10C). As a result, a plurality of wirings 23 are formed from the wiring layer 44. In FIG. 10C, a wiring 23a formed on the via plugs 22a and 22c and a wiring 23b formed on the via plugs 22b and 22d are illustrated. The wirings 23a and 23b are electrically connected to each other via the connection wiring 31. The wirings 23 may be formed by a damascene method. In this case, the via plug 22 and the wiring 23 may be simultaneously formed by a dual damascene method.

After that, the remaining part of the interlayer insulating film 7, the via plug 24, the wiring 25, and the like are formed on the substrate 1. In this way, the semiconductor device of at least one embodiment is manufactured.

As described above, the connection wiring 31 of this embodiment has an upper surface that is at the same height as the upper surface of the contact plug 21 and a lower surface that is at the same height as the lower surface of the contact plug 21. Therefore, according to at least one embodiment, it is possible to prevent an increase in the number of manufacturing steps of the semiconductor device due to the formation of wiring such as the connection wiring 31.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
    a substrate;
    a first semiconductor layer and a second semiconductor layer that each extend in a first direction perpendicular to a surface of the substrate;
    a first plug provided on the first semiconductor layer;
    a second plug provided on the second semiconductor layer;
    a connection wiring having an upper surface that is at a same height along the first direction as upper surfaces of the first and second plugs, and having a lower surface that is at a same height along the first direction as lower surfaces of the first and second plugs;
    a first wiring provided on the first plug and the connection wiring; and
    a second wiring provided on the second plug and the connection wiring.

2. The semiconductor device according to claim 1, wherein
    the first wiring is provided on the first plug via a third plug, and is provided on the connection wiring via a fourth plug, and
    the second wiring is provided on the second plug via a fifth plug, and is provided on the connection wiring via a sixth plug.

3. The semiconductor device according to claim 1, wherein the first plug, the second plug, and the connection wiring are made of a same material.

4. The semiconductor device according to claim 1, wherein the first and second wirings extend in a second direction parallel to the surface of the substrate.

5. The semiconductor device according to claim 1, further comprising:
    a plurality of electrode layers and a plurality of insulating layers alternately provided above the substrate,
    wherein the first and second semiconductor layers are provided in the plurality of electrode layers and the plurality of insulating layers.

6. The semiconductor device according to claim 1, further comprising:
    a seventh plug provided between the first and second semiconductor layers.

7. The semiconductor device according to claim 6, further comprising:
    a plurality of first insulating layers and a plurality of second insulating layers alternately provided above the substrate,
    wherein the seventh plug is provided in the plurality of first insulating layers and the plurality of second insulating layers.

8. The semiconductor device according to claim 6, wherein
    the connection wiring electrically connects the first wiring and the second wiring so as to detour around a structure on the seventh plug.

9. The semiconductor device according to claim 1, further comprising:
    a plurality of first electrode layers provided above the substrate;
    a plurality of first insulating layers provided above the substrate;
    a plurality of second insulating layers that are provided alternately with the plurality of electrode layers above the substrate and that are provided alternately with the plurality of first insulating layers above the substrate;
    a second electrode layer provided between the substrate and the plurality of first electrode layers;
    a third wiring provided between the substrate and the plurality of first insulating layers; and
    a seventh plug provided between the first and second semiconductor layers,
    wherein the first and second semiconductor layers are provided in the plurality of first electrode layers and the plurality of second insulating layers via first and second charge storage layers, respectively, and are electrically connected to the second electrode layer, and
    the seventh plug is provided in the plurality of first insulating layers and the plurality of second insulating layers and is electrically connected to the third wiring.

10. The semiconductor device according to claim 1, wherein the first wiring, the second wiring, and the connection wiring function as a bit line.

11. The semiconductor device according to claim 2, wherein the first and second plugs have a circular planar shape, and the third, fourth, fifth and sixth plugs have an elliptical planar shape.

12. A method for manufacturing a semiconductor device comprising:
    forming first and second semiconductor layers extending in a first direction perpendicular to a surface of a substrate;
    forming first and second plugs on the first and second semiconductor layers, respectively;
    forming a connection wiring having an upper surface that is at a same height as upper surfaces of the first and second plugs and a lower surface that is at a same height as lower surfaces of the first and second plugs;
    forming a first wiring on the first plug and the connection wiring; and
    forming a second wiring on the second plug and the connection wiring.

13. The method for manufacturing the semiconductor device according to claim 12,
    wherein a hole in which the first plug is buried, a hole in which the second plug is buried, and a groove in which the connection wiring is buried are formed at a same time.

14. The method for manufacturing the semiconductor device according to claim 12,
    wherein the first plug, the second plug, and the connection wiring are formed by dividing a same wiring layer.

15. The method for manufacturing the semiconductor device according to claim 12, further comprising:
    forming a hole for the first plug, a hole for the second plug, and a wiring groove in an insulating layer.

16. The method for manufacturing the semiconductor device according to claim 15, further comprising disposing a same material in the hole for the first plug, hole for the second plug, and the wiring groove.

17. The method for manufacturing the semiconductor device according to claim 16, further comprising, removing an upper portion of the same material to expose an upper surface of the first plug, the second plug and the connection wiring.

18. The method for manufacturing the semiconductor device according to claim 16, wherein the first plug, the second plug and the connection wiring are formed at a same time.

19. A method for manufacturing a semiconductor device comprising:
    providing a substrate;
    forming a first semiconductor layer extending in a first direction perpendicular to a surface of the substrate;
    forming a second semiconductor layer extending in the first direction;
    forming a wiring layer on the first and second semiconductor layers;
    dividing the wiring layer to form a first plug on the first semiconductor layer, a second plug on the second semiconductor layer, and a connection wiring;
    forming a first wiring on the first plug and the connection wiring; and
    forming a second wiring on the second plug and the connection wiring.

* * * * *